(12) United States Patent
Kirkwood et al.

(10) Patent No.: US 10,854,486 B2
(45) Date of Patent: Dec. 1, 2020

(54) SYSTEM AND METHOD FOR CHARACTERIZATION OF BURIED DEFECTS

(71) Applicant: KLA-Tencor Corporation, Milpitas, CA (US)

(72) Inventors: Jason Kirkwood, Mountain View, CA (US); Jan Lauber, San Francisco, CA (US)

(73) Assignee: KLA Corporation, Milpitas, CA (US)

( * ) Notice: Subject to any disclaimer, the term of this patent is extended or adjusted under 35 U.S.C. 154(b) by 137 days.

(21) Appl. No.: 16/189,497

(22) Filed: Nov. 13, 2018

(65) Prior Publication Data

US 2020/0090969 A1 Mar. 19, 2020

Related U.S. Application Data

(60) Provisional application No. 62/733,463, filed on Sep. 19, 2018.

(51) Int. Cl.
*H01L 21/67* (2006.01)
*G06T 7/00* (2017.01)
(Continued)

(52) U.S. Cl.
CPC ...... *H01L 21/67288* (2013.01); *G06K 9/6256* (2013.01); *G06K 9/6267* (2013.01);
(Continued)

(58) Field of Classification Search
CPC ... H01L 21/67288; G06T 7/0004; G06T 7/50; G06T 7/60; G06T 2207/20212;
(Continued)

(56) References Cited

U.S. PATENT DOCUMENTS

2018/0106732 A1 4/2018 Plihal et al.
2019/0073566 A1* 3/2019 Brauer ................ G06K 9/6262
(Continued)

FOREIGN PATENT DOCUMENTS

JP         5550862 B2    7/2014
KR    20060100051 A    9/2006
(Continued)

OTHER PUBLICATIONS

International Search Report dated Jan. 6, 2020 for PCT/US2019/051616.

*Primary Examiner* — Jerome Grant, II
(74) *Attorney, Agent, or Firm* — Suiter Swantz pc llo

(57) ABSTRACT

A system for defect detection and analysis is provided. The system may include an inspection sub-system and a controller including a memory and one or more processors. The inspection sub-system may include an illumination source and one or more detectors configured to acquire control patch images of defects of a control specimen along one or more detector channels. The one or more processors may be configured to train a defect classifier using the control patch images and known parameters associated with the defects of the control specimen. The inspection sub-system may be further configured to acquire patch images of identified defects on an additional specimen. The one or more processors may be configured to determine parameters of the identified defects using the defect classifier.

29 Claims, 8 Drawing Sheets

(51) Int. Cl.
*G06K 9/62* (2006.01)
*G06T 7/50* (2017.01)
*G06T 7/60* (2017.01)

(52) U.S. Cl.
CPC .............. *G06T 7/0004* (2013.01); *G06T 7/50* (2017.01); *G06T 7/60* (2013.01); *G06T 2207/10024* (2013.01); *G06T 2207/20081* (2013.01); *G06T 2207/20084* (2013.01); *G06T 2207/20212* (2013.01); *G06T 2207/30148* (2013.01)

(58) Field of Classification Search
CPC . G06T 2207/20081; G06T 2207/20084; G06T 2207/30148; G06T 2207/10024; G06T 7/62; G06K 9/6267; G06K 9/6256
USPC .......................................................... 382/149
See application file for complete search history.

(56) References Cited

U.S. PATENT DOCUMENTS

| | | | |
|---|---|---|---|
| 2019/0155164 A1* | 5/2019 | Chen | G01N 21/9501 |
| 2019/0370955 A1* | 12/2019 | Zhang | G06N 3/0472 |
| 2020/0098101 A1* | 3/2020 | Pandey | G06T 3/4053 |
| 2020/0098107 A1* | 3/2020 | Nakagawa | G01N 33/6872 |
| 2020/0130130 A1* | 4/2020 | Chen | B24B 37/005 |
| 2020/0134809 A1* | 4/2020 | Moioli | G06T 7/0006 |
| 2020/0134810 A1* | 4/2020 | Lee | G06T 7/0006 |

FOREIGN PATENT DOCUMENTS

| | | | | |
|---|---|---|---|---|
| KR | 101646743 B1 | 8/2016 | | |
| WO | 2016182857 A1 | 11/2016 | | |
| WO | WO2016182857 | * 11/2016 | ............. | H01L 21/66 |

* cited by examiner

SYSTEM AND METHOD FOR CHARACTERIZATION OF BURIED DEFECTS

CROSS-REFERENCE TO RELATED APPLICATION

The present application claims the benefit under 35 U.S.C. § 119(e) of U.S. Provisional Application Ser. No. 62/733,463, filed Sep. 19, 2018, entitled DEPTH MEASUREMENT OF BURIED DEFECTS IN VNAND STACKS USING DEEP-LEARNING, naming Jason Kirkwood and Jan Lauber as inventors, which is incorporated herein by reference in the entirety.

TECHNICAL FIELD

The present invention generally relates to defect review and classification and, more particularly, to the use of machine learning to conduct defect review and classification.

BACKGROUND

Fabricating semiconductor devices such as VNAND structures and semiconductor wafers typically includes forming a large number of film and insulating layers on top of a semiconductor substrate. During the fabrication process, defects may occur while fabricating any of the various layers. Detecting and/or measuring these defects may be very difficult, particularly for defects in layers below the surface of the device. Current systems and methods may not be able to accurately measure the size and depth of these defects. Therefore, it would be desirable to provide a system and method that cure one or more of the shortfalls of the previous approaches identified above.

SUMMARY

A system is disclosed, in accordance with one or more embodiments of the present disclosure. In one embodiment, the system includes an inspection sub-system. In another embodiment, the inspection sub-system includes one or more detection channels configured to acquire one or more patch images along one or more scattering angles from a specimen. In another embodiment, the system includes a controller communicatively coupled to the inspection sub-system, the controller including one or more processors and memory. In another embodiment, the one or more processors are configured to execute a set of program instructions stored in the memory, the set of program instructions configured to cause the one or more processors to: receive one or more control patch images of one or more training defects of a control specimen from the inspection sub-system; train a defect classifier based on the one or more control patch images acquired from the one or more training defects and one or more known parameters associated with the one or more training defects; direct the inspection sub-system to identify one or more defects of an additional specimen; receive one or more patch images of the one or more identified defects of the additional specimen from the inspection sub-system; and apply the defect classifier to the one or more patch images of the one or more identified defects of the additional specimen to determine one or more parameters of the one or more identified defects of the additional specimen.

A system is disclosed, in accordance with one or more embodiments of the present disclosure. In one embodiment, the system includes a controller communicatively coupled to an inspection sub-system. In another embodiment, the controller includes one or more processors and memory, wherein the one or more processors are configured to execute a set of program instructions stored in the memory, the set of program instructions configured to cause the one or more processors to: receive one or more control patch images of one or more training defects of a control specimen from the inspection sub-system; train a defect classifier based on the one or more control patch images acquired from the one or more training defects and one or more known parameters associated with the one or more training defects; direct the inspection sub-system to identify one or more defects of an additional specimen; receive one or more patch images of the one or more identified defects of the additional specimen from the inspection sub-system; and apply the defect classifier to the one or more patch images of the one or more identified defects of the additional specimen to determine one or more parameters of the one or more identified defects of the additional specimen.

A method is disclosed, in accordance with one or more embodiments of the present disclosure. In one embodiment, the method includes acquiring, with an inspection sub-system, one or more control patch images of one or more training defects of a control specimen. In another embodiment, the method includes training a defect classifier based on the one or more control patch images and one or more known parameters associated with the one or more training defects. In another embodiment, the method includes identifying one or more defects on an additional specimen. In another embodiment, the method includes acquiring, with the inspection sub-system, one or more patch images of the one or more identified defects of the additional specimen. In another embodiment, the method includes determining one or more parameters of the one or more identified defects of the additional specimen with the defect classifier based on the one or more patch images.

It is to be understood that both the foregoing general description and the following detailed description are exemplary and explanatory only and are not necessarily restrictive of the invention as claimed. The accompanying drawings, which are incorporated in and constitute a part of the specification, illustrate embodiments of the invention and together with the general description, serve to explain the principles of the invention.

BRIEF DESCRIPTION OF THE DRAWINGS

The numerous advantages of the disclosure may be better understood by those skilled in the art by reference to the accompanying figures in which.

DETAILED DESCRIPTION

The present disclosure has been particularly shown and described with respect to certain embodiments and specific features thereof. The embodiments set forth herein are taken to be illustrative rather than limiting. It should be readily apparent to those of ordinary skill in the art that various changes and modifications in form and detail may be made without departing from the spirit and scope of the disclosure.

Reference will now be made in detail to the subject matter disclosed, which is illustrated in the accompanying drawings.

Referring generally to FIGS. 1A-6, a system and method for defect detection and classification using machine learning are shown and described, in accordance with one or more embodiments of the present disclosure.

Embodiments of the present disclosure are directed to the use of a machine learning classifier (e.g., defect classifier) to conduct defect detection and classification. More specifically, embodiments of the present disclosure are directed to training a defect classifier with images of defects with known parameters. Additional embodiments of the present disclosure are directed to acquiring images of defects with an inspection sub-system including three or more detector channels.

When fabricating semiconductor devices, such as VNAND structures and semiconductor wafers, a large number of layers, including film layers and insulating layers, are formed on top of a semiconductor substrate. This multi-layer fabrication process may result in vertically layered/stacked semiconductor devices. Throughout the fabrication process, defects may occur in one or more of the layers of the device. Detecting and/or measuring these defects, particularly those which are buried below the surface of the semiconductor device, may be a difficult and inefficient process. By way of example, some current methods for determining the location and depth of a defect include acquiring multiple images of the defect at varying focus settings. While comparing the acquired images may provide some information as to the size and depth of the defect, the information is often imprecise and only of limited use. Furthermore, the process is time-consuming and tedious. Accordingly, embodiments of the present disclosure are directed to a system and method for measuring the size and depth of defects buried within stacked semiconductor devices.

Figure 1A:
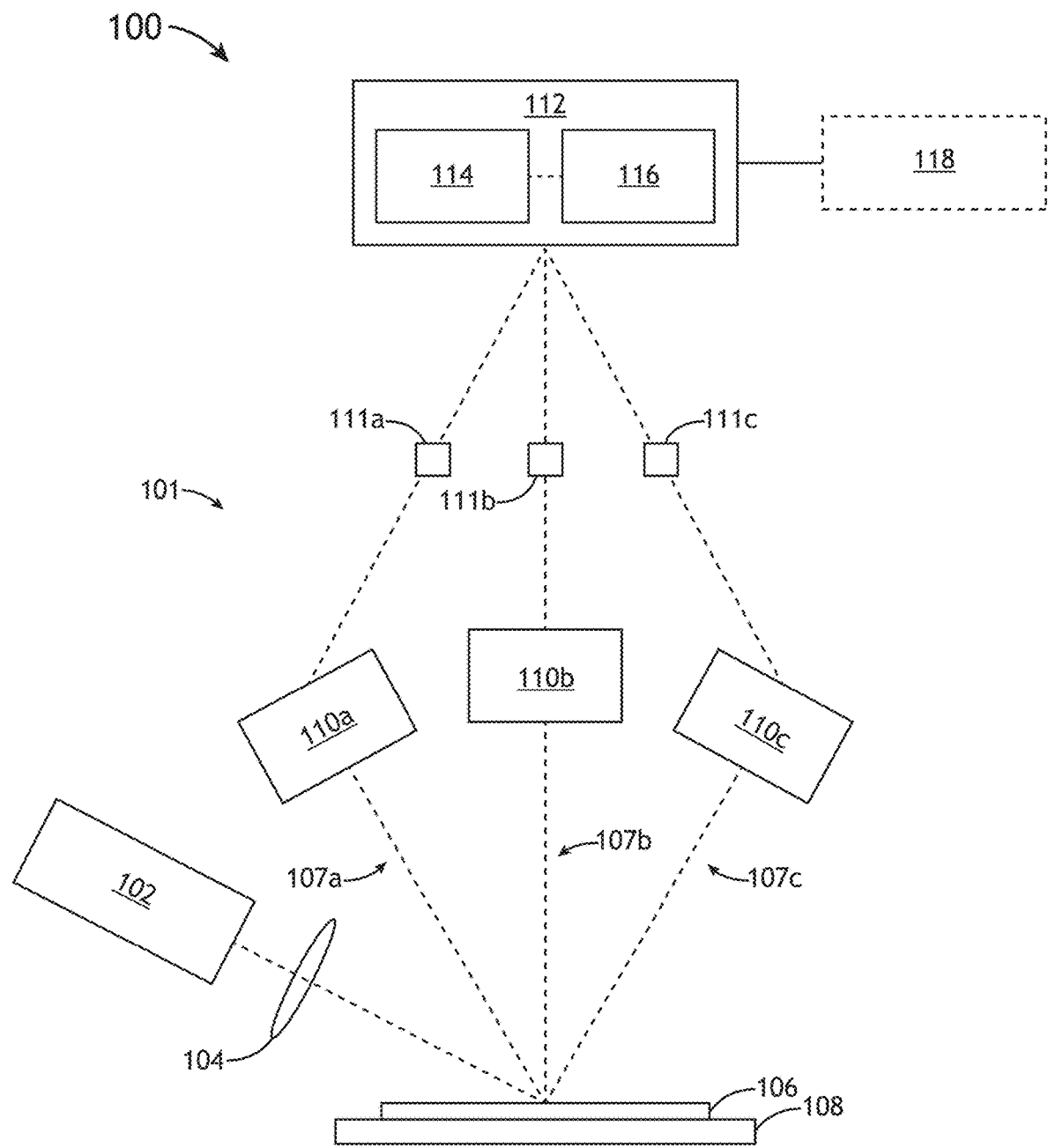
FIGS. 1A-1B illustrate simplified block diagrams of a system for defect detection and analysis, in accordance with one or more embodiments of the present disclosure.

FIG. 1A illustrates a simplified block diagram of a system 100 for defect detection and analysis, in accordance with one or more embodiments of the present disclosure. In one embodiment, the system 100 includes an inspection sub-system 101 and a controller 112.

In one embodiment, the inspection sub-system 101 includes an illumination source. The illumination source 102 is configured to generate an illumination beam and direct the illumination beam to a specimen 106. In another embodiment, the illumination source 102 is configured to direct the illumination beam to the specimen 106 such that the illumination beam strikes the specimen 106 in a focused line configuration. The illumination source 102 may include any illumination source known in the art for generating an illumination beam. For example, illumination source 102 may include a narrow band illumination source, such as one or more lasers. For instance, illumination source 102 may include one or more lasers configured to generate an illumination beam with a wavelength of 355 nm.

In another embodiment, one or more optical elements 104 are configured to direct the illumination beam to the specimen 106. The one or more optical elements 104 may include any optical elements known in the art including, but not limited to, one or more oblique diverters, one or more lenses, one or more mirrors, one or more filters, one or more beam splitters, and the like. Similarly, the specimen 106 may include any sample or substrate known in the art including, but not limited to, semiconductor wafers, semiconductor substrates, VNAND structures, and the like.

In one embodiment, specimen 106 is disposed on a stage assembly 108 to facilitate movement of specimen 106. Stage assembly 108 may include any stage assembly 108 known in the art including, but not limited to, an X-Y stage, an R-θ stage, and the like. In another embodiment, stage assembly 108 is capable of adjusting the height of specimen 106 during inspection or imaging to maintain focus on the specimen 106.

In one embodiment, inspection sub-system 101 includes one or more detection channels 107. The one or more detection channels 107 may include one or more detectors 110 configured to collect illumination scattered from the specimen 106 and acquire images of the specimen 106. For example, as shown in FIG. 1A, system 100 may include a first detection channel 107a including a first detector 110a, a second detection channel 107b including a second detector 110b, and a third detection channel 107c including a third detector 110c. Inspection sub-system 101 and detection channels 107a, 107b, 107c may be further understood with reference to FIG. 1B.

Figure 1B:
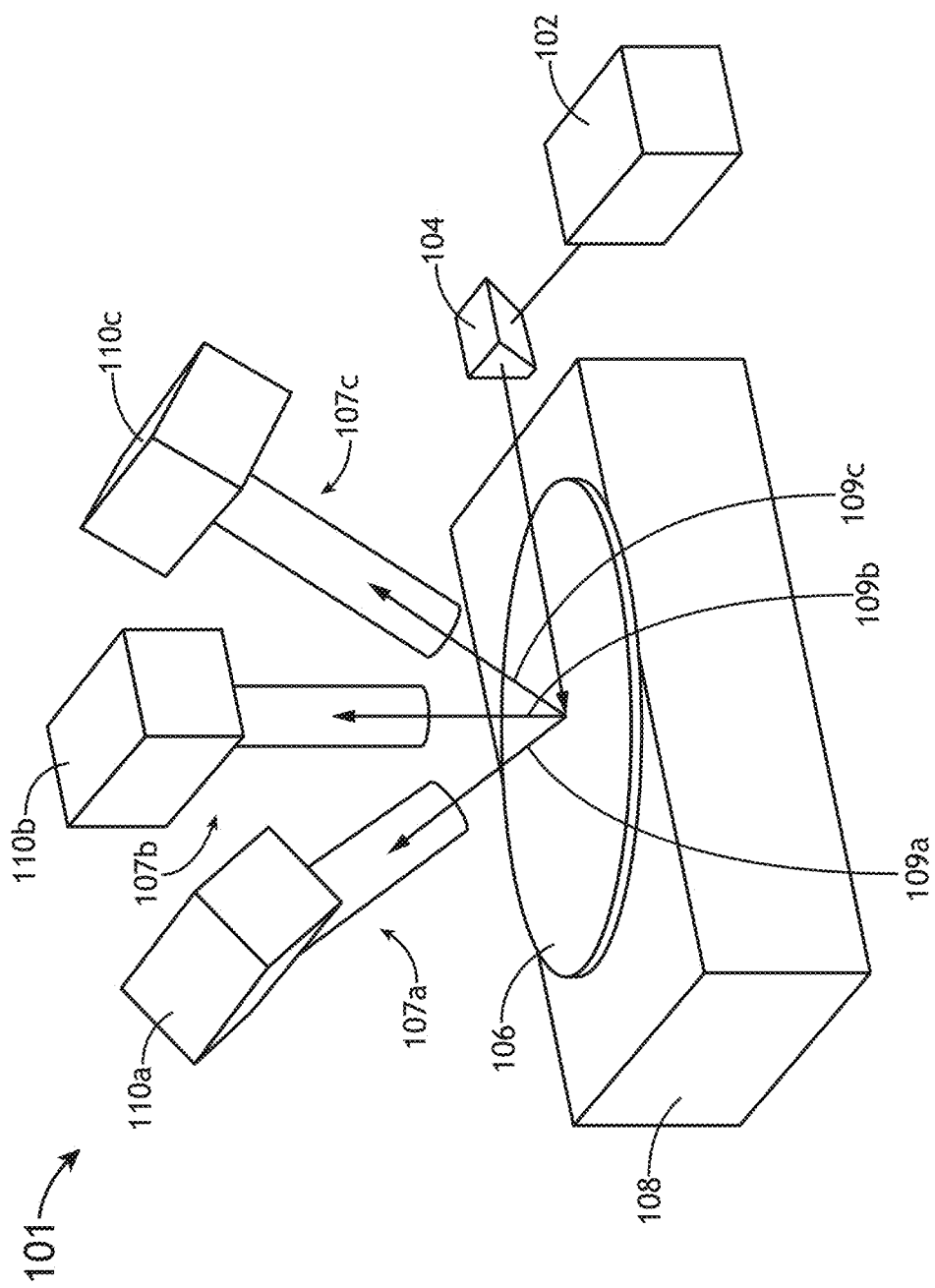

FIG. 1B illustrates a simplified block diagram of the inspection sub-system 101, in accordance with one or more embodiments of the present disclosure. As shown in FIG. 1B, inspection sub-system 101 may include, but is not limited to, an illumination source 102, one or more optical elements 104, a specimen 106, a stage assembly 108, and one or more detection channels 107a, 107b, 107c including one or more detectors 110a, 110b, 110c.

In one embodiment, the one or more detection channels 107 include one or more detectors 110. In additional and/or alternative embodiments, the one or more detection channels 107 may include one or more optical elements configured to collect illumination scattered from the specimen 106 and direct the illumination to the one or more detectors 110. The one or more optical elements may include any optical elements known in the art including, but not limited to, one or more mirrors, one or more lenses, one or more beam splitters, and the like.

In one embodiment, the one or more detection channels 107 are configured to collect illumination scattered from the specimen 106 with the one or more detectors 110. For example, the one or more detectors 110 may be configured to collect illumination scattered from the specimen 106 in order to identify one or more defects in the specimen 106. In another embodiment, the one or more detectors 110 are configured to acquire images of the specimen 106. The one or more detectors 110 may include any imaging device and/or detector known in the art for acquiring images of a specimen 106 including, but not limited to, one or more cameras.

As noted previously herein, the one or more detection channels 107 may include one or more detectors 110. By way of example, the first detection channel 107a may include a first detector 110a, the second detection channel 107b may include a second detector 110b, and the third detection channel 107c may include a third detector 110c. In another embodiment, the one or more detection channels 107 may be configured to collect illumination scattered form the specimen 106 at one or more angles. In this regard, the first detection channel 107a may be configured to acquire patch images 111a of the specimen 106 along a first scattering direction 109a, the second detection channel 107a may be configured to acquire patch images 111b of the specimen 106 along a second scattering direction 109b, and the third detection channel 107c may be configured to acquire patch images 111c of the specimen 106 along a third scattering direction 1009c.

For example, as shown in FIG. 1B, the first detection channel 107a and the third detection channel 107c may be configured to acquire patch images 111a, 111c of the specimen 106 along a first scattering direction 109a and a third scattering direction 109c, respectively, wherein the first scattering direction 109a and third scattering direction 109c are arranged at an angle with respect to the surface of the specimen 106. Continuing with the same example, the second detection channel 107b may be configured to acquire patch images 111b of the specimen 106 along a second scattering angle 109c, wherein the second scattering direction 109b is arranged substantially orthogonal with respect to the surface of the specimen 106.

In an additional and/or alternative embodiment, a single detector 110 including one or more sensors may be configured to acquire patch images 111 along multiple scattering directions 109. For example, a single detector 110 with three or more sensors may be configured to acquire patch images 111 along the first scattering direction 109a, the second scattering direction 109b, and the third scattering direction 109c.

While FIGS. 1A and 1B illustrate an inspection sub-system 101 including three detectors 110 configured to acquire patch images 111 along three scattering angles 109, this is not to be regarded as a limitation of the present disclosure, unless noted otherwise herein. In this regard, it is contemplated that inspection sub-system 101 may be arranged in any configuration including, but not limited to, a one-detection-channel configuration, a two-detection-channel configuration, a three-detection-channel configuration, a five-detection-channel configuration, and the like. Comparisons between various channel configurations will be discussed in further detail herein.

Reference will again be made to FIG. 1A. In one embodiment, the one or more detectors 110 of inspection sub-system 101 are communicatively coupled to a controller 112. The controller 112 may include one or more processors 114 and a memory 116. In another embodiment, the controller 112 may be communicatively coupled to one or more process tools 118. The one or more process tools 118 may include any number of upstream or downstream process tools. The one or more process tools 118 may include any process tools known in the art including, but not limited to, one or more lithography tools, one or more polishing tools, and the like. By way of another example, the one or more process tools may include one or more metrology tools. In another embodiment, the controller 112 is communicatively coupled to a user interface (not shown).

In one embodiment, the one or more processors 114 may be configured to execute a set of program instructions stored in memory 116, wherein the set of program instructions are configured to cause the one or more processors 114 to carry out the steps of the present disclosure.

In one embodiment, the set of program instructions are configured to cause the one or more processors 114 to acquire, with the inspection sub-system 101, one or more control patch images 111 of one or more training defects of a control specimen 106a. In another embodiment, the set of program instructions are configured to cause the one or more processors 114 to train a defect classifier based on the one or more control patch images 111 and one or more known parameters associated with the one or more training defects. In another embodiment, the set of program instructions are configured to cause the one or more processors 114 to identify one or more defects on an additional specimen 106b with the inspection sub-system 101. In another embodiment, the set of program instructions are configured to cause the one or more processors 114 to acquire, with the inspection sub-system 101, one or more patch images 111 of the one or more identified defects of the additional specimen 106b. In another embodiment, the set of program instructions are configured to cause the one or more processors 114 to determine one or more parameters of the one or more identified defects of the additional specimen 106b with the defect classifier based on the one or more patch images 111. Each of these steps performed by the one or more processors will be discussed in further detail herein.

In one embodiment, a control specimen 106 (hereinafter referred to as "control specimen 106a") may be placed on the sample stage 108. The control specimen 106a may have been previously inspected such that the defects (e.g., "training defects") of control specimen 106a are known. It is contemplated herein that the control specimen 106a may have been inspected with system 100 and/or one or more external inspection systems. Additionally, it is contemplated herein that one or more parameters of known, identified defects (e.g., training defects) of control specimen 106a may be determined and stored in memory 116. Parameters associated with training defects may include, but are not limited to, the location of the defects, the depth of the defects, the size of the defects, the type of the defects (e.g., defect category), and the like. It is noted herein that training defects may be purposely created or "planted" within control specimen 106a such that various parameters (e.g., location, depth, size, type) may be known with a high degree of accuracy.

In one embodiment, the set of program instructions are configured to cause the one or more processors 114 to acquire, with the inspection sub-system 101, one or more control patch images 111 of one or more training defects of the control specimen 106a. For example, the one or more processors 114 may cause the one or more detectors 110 of inspection sub-system 101 to acquire patch images 111 of the control specimen 106a. In this regard, the first detector 110a may acquire a first control patch image 111a of the control specimen 106a along the first scattering direction 109a, the second detector 110b may acquire a second control patch image 111b of the control specimen 106a along the second scattering direction 109b, and the third detector 110c may acquire a third control patch image 111c of the control specimen 106a along the third scattering direction 109c. It is noted herein that the term "control" preceding the term "patch images 111" may be regarded as denoting the patch images 111 acquired from a control specimen 106a.

In another embodiment, the set of program instructions are configured to cause the one or more processors 114 to receive the one or more control patch images 111. In one embodiment, the one or more processors 114 are configured to acquire the one or more control patch images 111 from the one or more detectors 110. In an additional and/or alternative embodiment, the one or more detectors 110 are configured to transmit the one or more control patch images 111 to the controller 112 and/or one or more processors 114. The one or more processors 114 may be further configured to store the one or more control patch images 111 in memory 118.

It is noted herein that the focus and quality of the patch images 111 may be dependent upon the focus of the respective detectors 110. For example, if the focus of the first detector 110a is focused on the surface of the specimen 106, a defect buried below the surface of the specimen 106 may be out of focus. In this regard, the focus of one or more of the detectors 110 may be adjusted. By adjusting the focus of one or more detectors 110, the shape of the patch image 111 of the defect may be changed as a function of the depth of the defect. This information may then be used to determine the depth of the defect in subsequent steps. By way of example, the defect classifier may utilize the differences between patch images 111 acquired with varying focuses to determine the depth of the defect.

It is contemplated that the "global focus" of the inspection sub-system 101 may be adjusted. In additional and/or alternative embodiments, the individual focus of each of the one or more detectors 110 may be individually adjusted. In another embodiment, subsequent patch images 111 may be acquired following the adjustment of the detector 110 focus. It is contemplated that the focus of one or more of the detectors 110 may be adjusted based on a number of factors including, but not limited to, the quality of the acquired patch images 111, the focus of the acquired patch images 111, and the like. The focus and quality of patch images 111 depicting defects of various sizes and depths may be better understood with reference to FIG. 2

Figure 2:
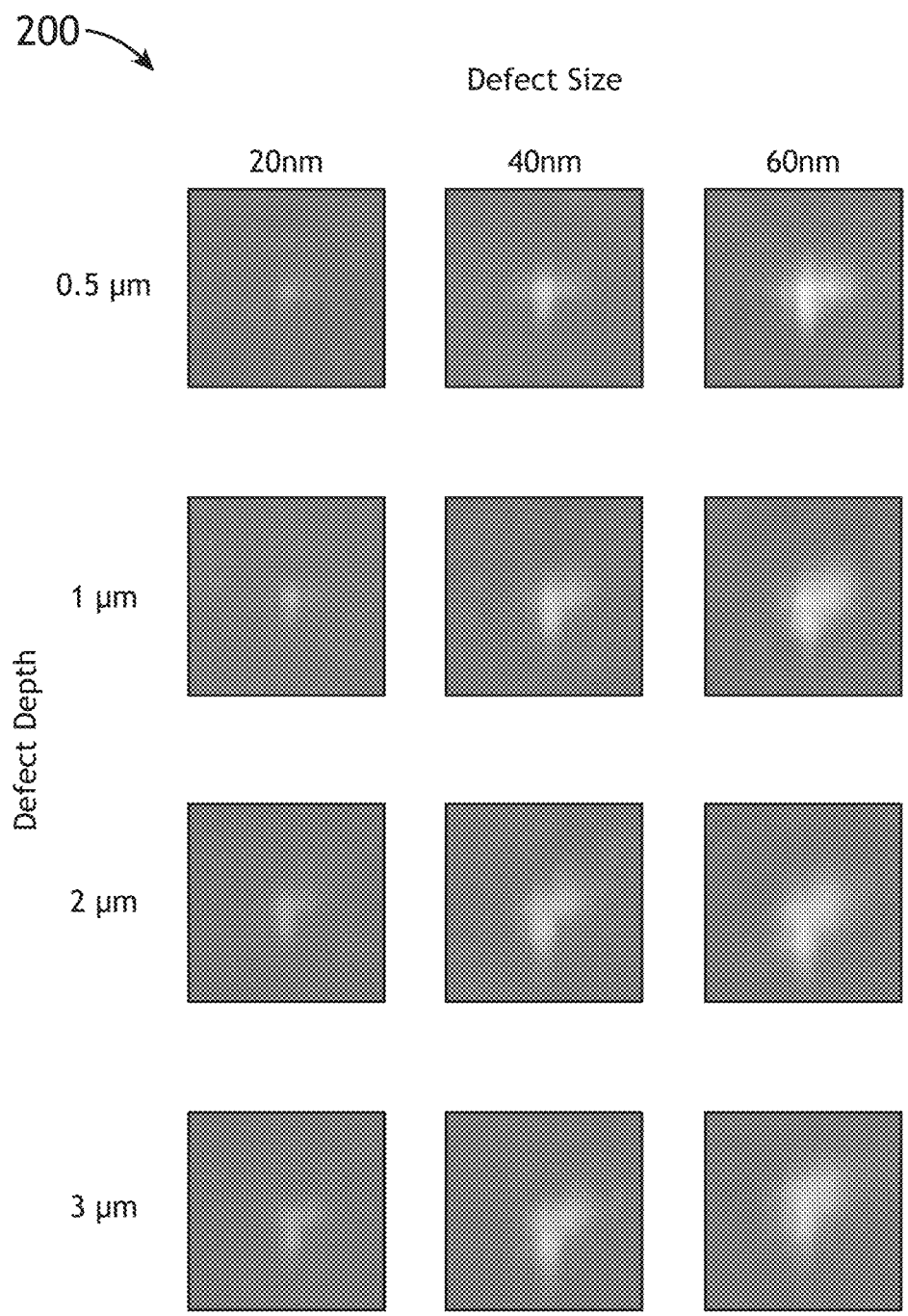
FIG. 2 illustrates a table of images acquired with the system of FIGS. 1A-1B depicting defects of varying sizes at varying depths, in accordance with one or more embodiments of the present disclosure.

FIG. 2 illustrates a table 200 of patch images 111 acquired with system 100 depicting defects of varying sizes at varying depths, in accordance with one or more embodiments of the present disclosure.

As may be seen in FIG. 2, the first column of patch images 111 in table 200 illustrate images of defects which are 20 nm in size, wherein the second and third columns of patch images 111 illustrate images of defects which are 40 nm and 60 nm in size, respectively. Similarly, the first row of patch images patch images 111 in table 200 illustrate images of defects with depths of 0.36 µm, wherein the second, third, and fourth rows of patch images 111 illustrate images of defects with depths of 1.2 µm, 2.04 µm, and 2.88 µm, respectively.

Reference will again be made to FIG. 1A.

In another embodiment, the set of program instructions are configured to cause the one or more processors 114 to train a defect classifier based on the one or more control patch images 111 and the one or more known parameters associated with the one or more training defects. The defect classifier may include any type of deep learning technique and/or machine learning algorithm or classifier known in the art including, but not limited to, a convolutional neural network (CNN) (e.g., GoogleNet, AlexNet, and the like), an ensemble learning classifier, a random forest classifier, artificial neural network (ANN), and the like.

For example, in embodiments where the control specimen 106a is planted with training defects, and parameters (e.g., location, size, depth, type, and the like) of the training defects are stored in memory 116, the one or more processors 114 may train a defect classifier with one or more supervised learning techniques. For instance, parameters of one or more control patch images 111 of a training defect in control specimen 106a may be stored in memory 116. In this example, the one or more processors 114 may train a defect classifier via supervised learning by providing the control patch images 111 and the parameters of the training defects to the defect classifier. It is noted herein that the defect classifier may include any algorithm or predictive model configured to predict and/or classify one or more parameters of identified defects. Training the defect classifier may be better understood with reference to FIGS. 3A-3B.

Figure 3A:
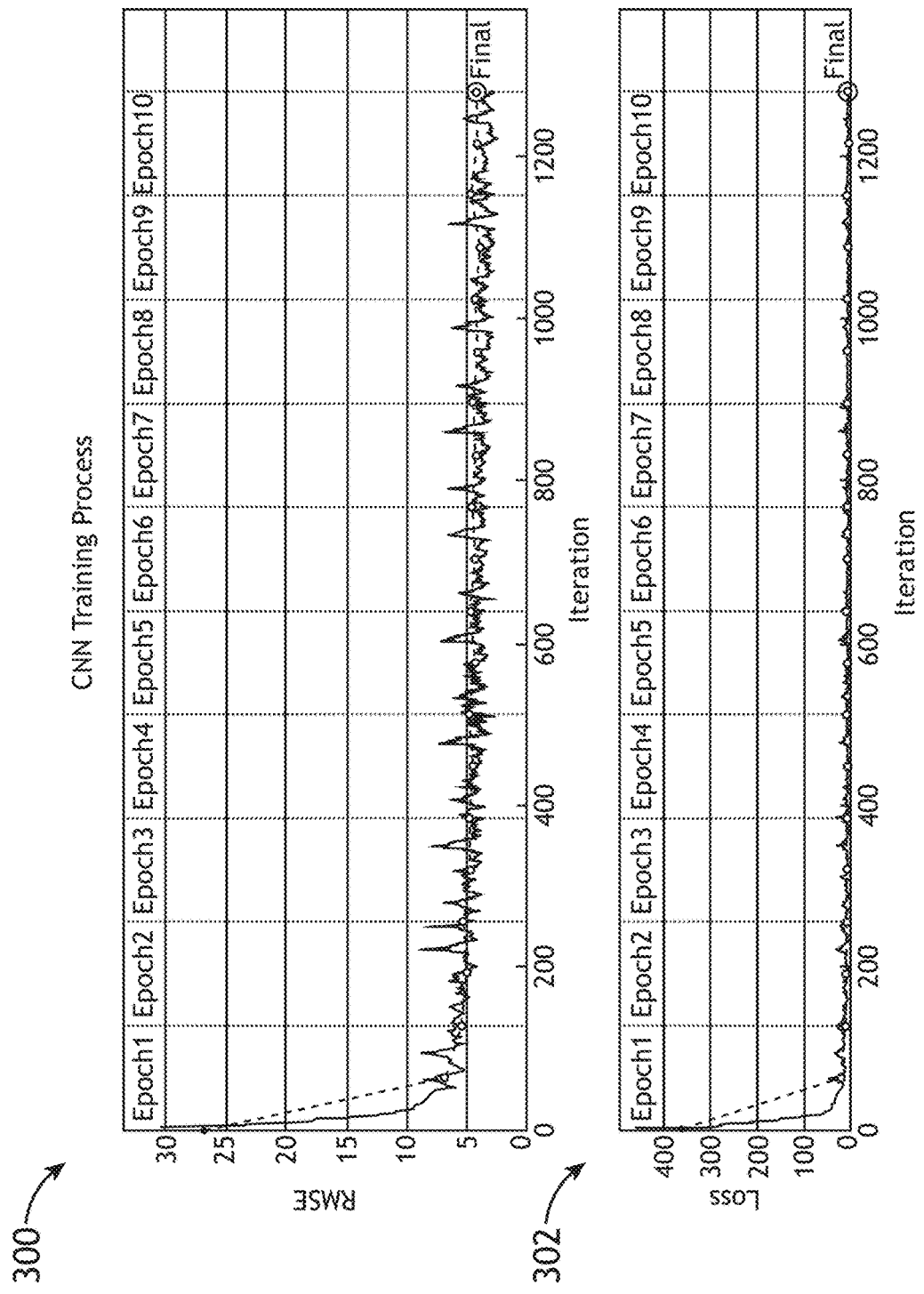
FIGS. 3A-3B illustrate graphs of a convolutional neural network (CNN) training process, in accordance with one or more embodiments of the present disclosure.
Figure 3B:
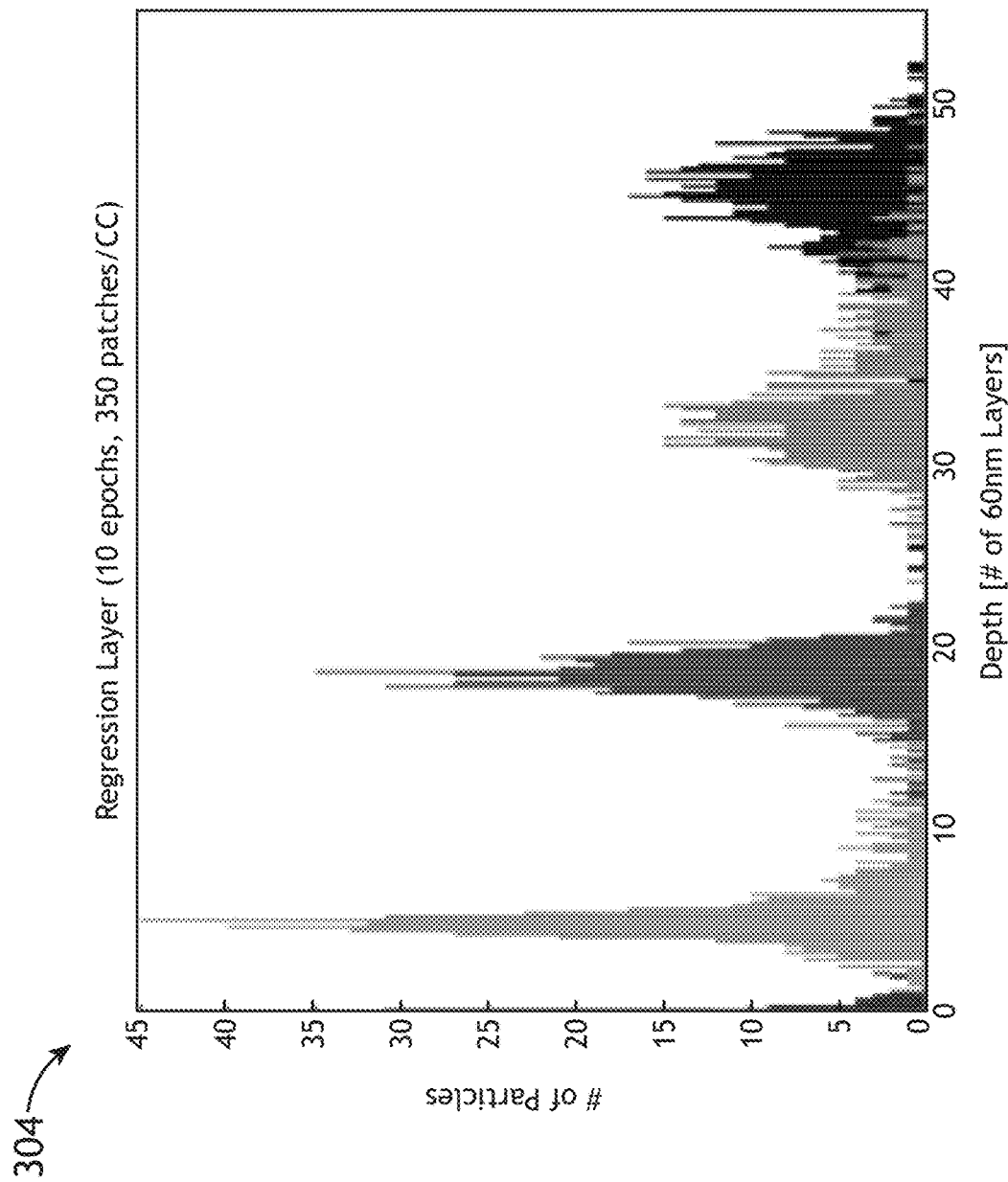

FIGS. 3A-3B illustrate graphs 300, 302, 304 of a convolutional neural network (CNN) training process, in accordance with one or more embodiments of the present disclosure. In particular, FIG. 3A illustrates graphs 300, 302 of the CNN training process, and FIG. 3B illustrates a histogram graph 304 depicting the depth measurement of a selected set of defects.

Graph 300 of FIG. 3A illustrates the Root Mean Square Error (RMSE) of the CNN (e.g., defect classifier) as the CNN is being trained. As may be seen in graph 300, the RMSE may decrease dramatically during Epoch 1 (first period of data provided to the CNN), and slightly decrease through subsequent epochs until a final RMSE value, indicating a trained CNN. Accordingly, graph 300 illustrates that the CNN may continue to improve as more data (e.g., control patch images 111 and known parameters associated with the one or more training defects) are provided to the CNN (e.g., defect classifier). As may be seen in FIG. 3B, the CNN (e.g., defect classifier of system 100) may have identified defects which are centered approximately at 5 nm, 20 nm, 33 nm and 45 nm.

Reference will again be made to FIG. 1A.

In another embodiment, the control specimen 106a may be removed from the stage assembly 108, and an additional specimen 106b may be placed on the stage assembly 108. In embodiments, the additional specimen 106b may include a specimen 106 which is different from that of the control specimen 106a. For example, additional specimen 106b may include, but is not limited to, a product semiconductor wafer, a product VNAND structure, and the like. In this regard, the additional specimen 106b may include any specimen 106 following control specimen 106a which is to be inspected for defects. In this regard, as compared to the control specimen 106a, in which parameters of training defects may have been previously known, parameters of identified defects in additional specimen 106b may be unknown and of interest when analyzing the additional specimen 106b.

In another embodiment, the set of program instructions are configured to cause the one or more processors 114 to identify one or more defects on an additional specimen 106b with the inspection sub-system 101. For example, the one or more processors 114 may receive one or more images from the detectors 110 and utilize one or more detection algorithms to identify one or more defects of additional specimen 106b. It is noted herein that the one or more processors 114 may utilize any algorithm or detection procedure known in the art to identify one or more defects of additional specimen 106b. As noted previously herein, in an additional and/or alternative embodiment, one or more defects may be identified on additional specimen 106b using an inspection system external to inspection sub-system 101.

In another embodiment, the set of program instructions are configured to cause the one or more processors 114 to acquire, with the inspection sub-system 101, one or more patch images 111 of the one or more identified defects of the additional specimen 106b. For example, the one or more processors 114 may cause the one or more detectors 110 of inspection sub-system 101 to acquire patch images 111 of the additional specimen 106b. In this regard, the first detector 110a may acquire a first patch image 111a of the additional specimen 106b along the first scattering direction 109a, the second detector 110b may acquire a second patch image 111b of the additional specimen 106b along the second scattering direction 109b, and the third detector 110c may acquire a third patch image 111c of the additional specimen 106b along the third scattering direction 109c. In one embodiment, as noted previously herein, the focus of one or more detectors 110 may be adjusted.

In one embodiment, the one or more patch images 111 may be combined into a single RGB image. Each of the color planes of the RGB image may correspond to a patch image 111 acquired by each of the detector channels 109. For example, in embodiments with a three-detection-channel configuration, as depicted in FIGS. 1A and 1B, a first color plane of an aggregate RGB image may correspond to a first patch image 111a acquired along the first detector channel 109a, a second color plane may correspond to a second patch image 111b acquired along the second detector channel 109b, and a third color plane may correspond to a third patch image 111c acquired along the third detector channel 109c.

In another embodiment, the set of program instructions are configured to cause the one or more processors 114 to receive the one or more patch images 111 of the additional specimen 106b. As noted previously herein, the one or more processors 114 may be configured to acquire the one or more patch images 111 of the additional specimen 106b from the one or more detectors 110. In an additional and/or alternative embodiment, the one or more detectors 110 may be configured to transmit the one or more patch images 111 to the controller 112 and/or one or more processors 114. The one or more processors 114 may be further configured to store the one or more patch images 111 of additional specimen 106b in memory 118.

In another embodiment, the set of program instructions are configured to cause the one or more processors 114 to determine one or more parameters of the one or more identified defects of the additional specimen 106b with the defect classifier based on the one or more patch images 111. In this regard, the one or more patch images 111 of the additional specimen 106b may be provided to the trained defect classifier. The defect classifier may then be configured to determine one or more parameters of the one or more defects of the additional specimen 106b based on the one or more received patch images 111. For example, the defect classifier may be configured to determine the size and depth of the one or more defects. By way of another example, the defect classifier may be configured to determine the location of the one or more defects. By way of another example, the defect classifier may be configured to categorize the one or more defects based on the type/character of the one or more defects. It is noted herein that the parameters determined by the defect classifier may include any parameters known in the art which may be of interest in analyzing a specimen 106 including, but not limited to, location of the defect, size of the defect, depth of the defect, category/type of the defect, and the like.

In another embodiment, the one or more parameters of the one or more defects determined by the defect classifier are stored in memory 118. In this regard, memory 118 may be configured to compile a database which includes data associated with each of the inspected defects. For example, memory 118 may be configured to compile a database which includes the size, depth, location, category/type, and other information regarding the one or more defects.

In another embodiment, the set of program instructions are configured to cause the one or more processors 114 to adjust one or more characteristics of the one or more process tools 118. As noted previously herein, the one or more process tools 118 may include any number of upstream or downstream process tools. The one or more process tools 118 may include any process tools known in the art including, but not limited to, one or more lithography tools, one or more polishing tools, and the like. By way of another example, the one or more process tools may include one or more metrology tools. In another embodiment, the controller 112 is communicatively coupled to a user interface (not shown).

Adjusting one or more characteristics of the one or more process tools 118 may include, but is not limited to, adjusting a stage assembly of the process tools 118, adjusting the intensity and/or direction of an illumination of the process tools 118, and the like. In this regard, the one or more processors 114 may be configured to adjust one or more characteristics of the one or more process tools 118 in a feed-forward or feedback communication loop. It is noted herein that the examples provided for adjusting characteristics of the one or more process tools 118 are provided solely for illustrative purposes, and are not to be regarded as limiting. In this regard, adjusting one or more characteristics of the process tools 118 may include adjusting any characteristic of a process tool 118 known in the art.

Figure 4:
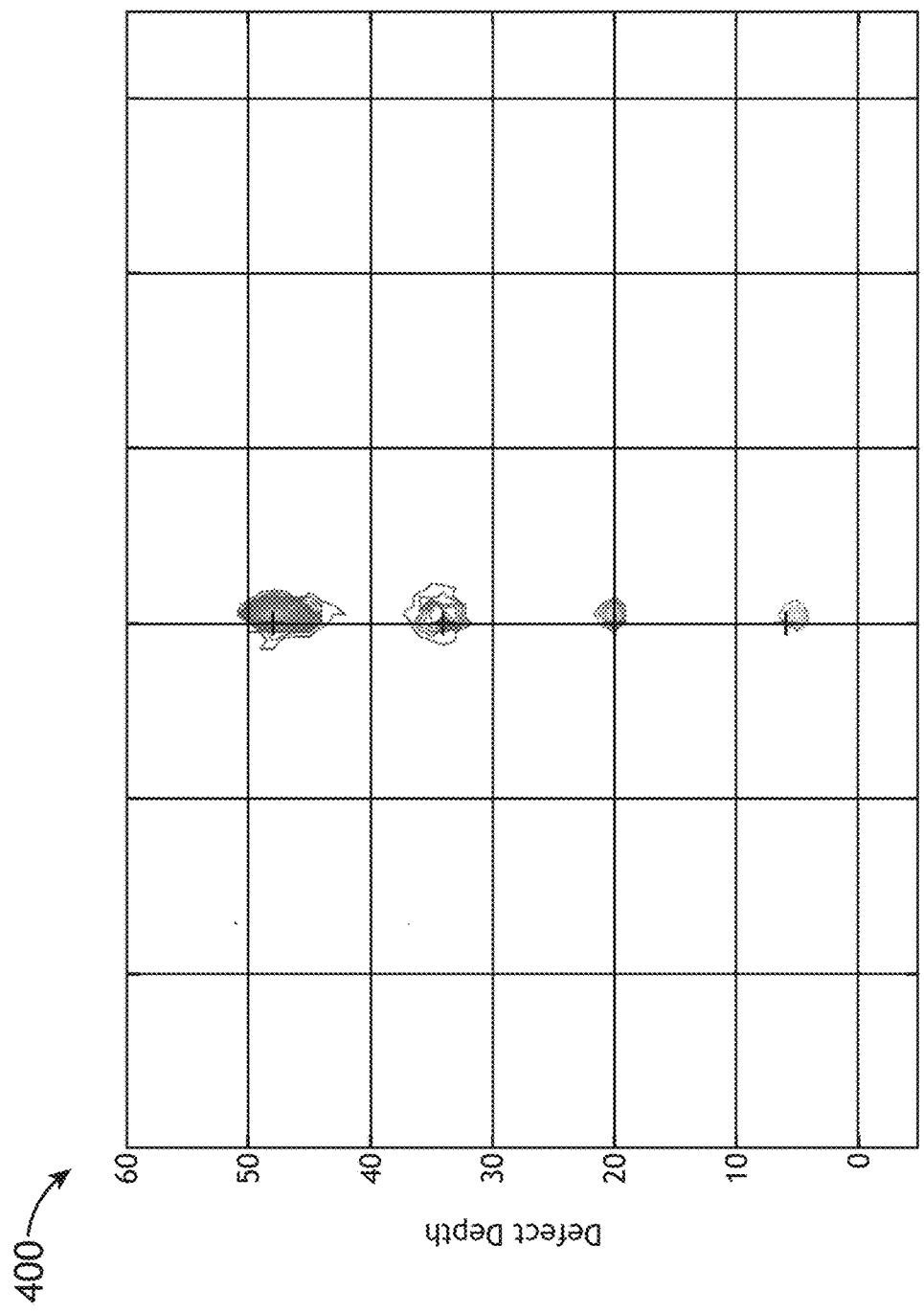
FIG. 4 illustrates a contour plot illustrating the separation of defects of varying depth and size, in accordance with one or more embodiments of the present disclosure.
Figure 5:
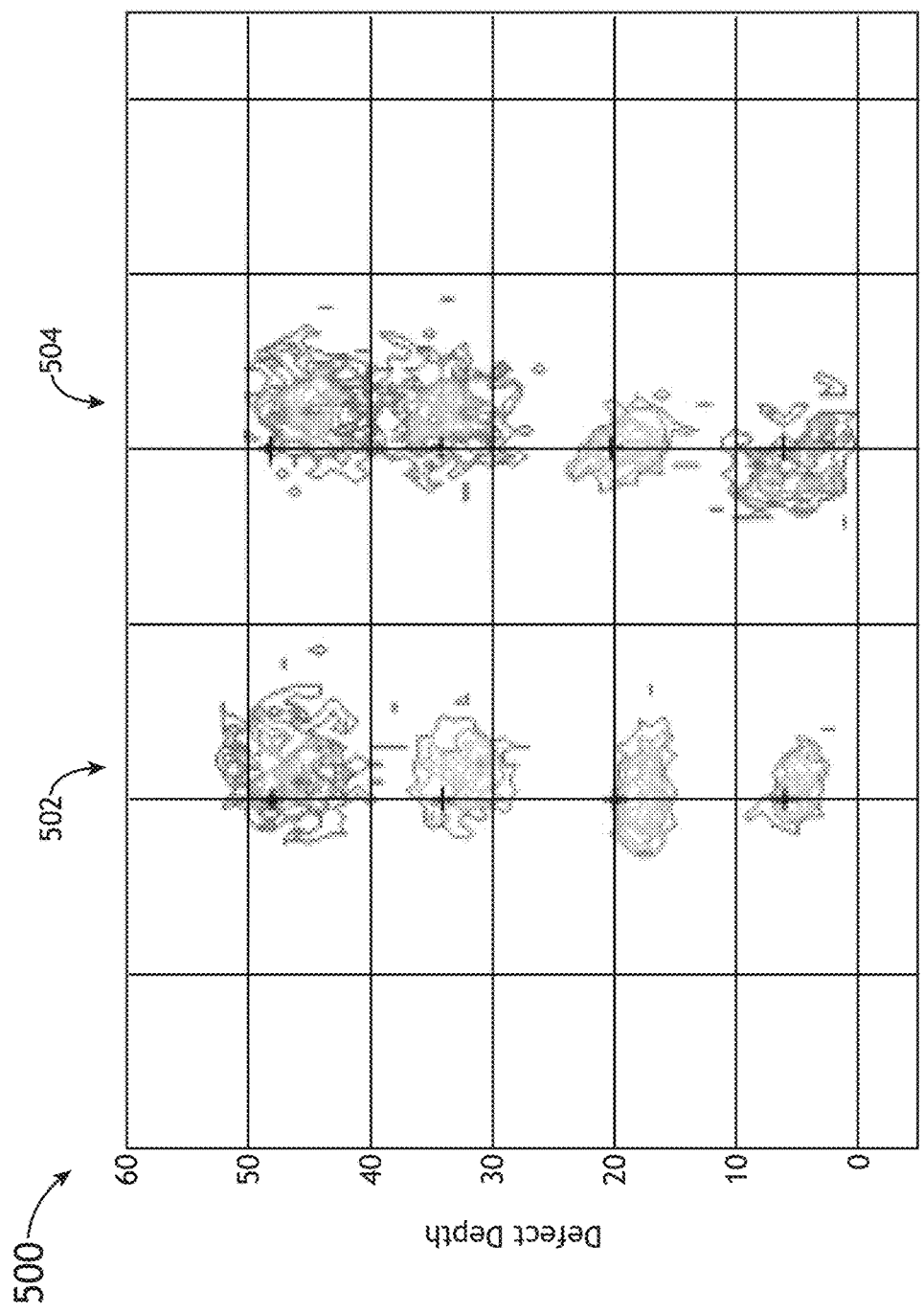
FIG. 5 illustrates a contour plot illustrating the separation of defects of varying depth and size using a three-detection-channel configuration and a one-detection-channel configuration, in accordance with one or more embodiments of the present disclosure.

The ability of system 100 to determine parameters of interest of defects in an additional specimen 106 may be further understood with reference to FIGS. 4 and 5.

FIG. 4 illustrates a contour plot 400 illustrating the separation of defects of varying depth and size, in accordance with one or more embodiments of the present disclosure.

System 100 may be able to clearly distinguish defects with varying depths from one another. For example, as shown in FIG. 4, the defect classifier of system 100 may have been able to identify defects centered at approximately 5 nm, 20 nm, 33 nm, and 45 nm. Plot 400 illustrates that the defect classifier of system 100 may be capable of identifying and separating defects into discrete categories according to the depth and/or size of the defects. In this regard, embodiments of the present disclosure are capable of producing higher defect depth resolution than may have been achieved with previous inspection approaches. It is further noted herein that these identified defects depicted in FIG. 4 may correspond to the CNN training process data illustrated in graph 304 of FIG. 3B.

FIG. 5 illustrates a contour plot 500 illustrating the separation of defects of varying depth and size using a three-detection-channel configuration and a one-detection-channel configuration, in accordance with one or more embodiments of the present disclosure. In particular, plot 502 illustrates identified defects utilizing a three-detection-channel configuration, and plot 504 illustrates identified defects utilizing a one-detection-channel configuration. Comparing plot 502 and 504, it may be seen that embodiments with a three-detection-channel configuration may be able to provide significantly improved depth resolution as compared to embodiments with a one-detection-channel configuration.

As noted previously, system 100 may also include a user interface (not shown). In one embodiment, a user interface is communicatively coupled to the controller 112. In one embodiment, the user interface may include, but is not limited to, one or more desktops, tablets, smartphones, smart watches, or the like. In another embodiment, the user interface includes a display used to display data of the system 100 to a user. The display of the user interface may include any display known in the art. For example, the display may include, but is not limited to, a liquid crystal display (LCD), an organic light-emitting diode (OLED) based display, or a CRT display. The user interface may further be configured to receive one or more input commands from a user, wherein the one or more input commands are configured to alter one or more components of the system 100. Those skilled in the art should recognize that any display device capable of integration with a user interface is suitable for implementation in the present disclosure. In another embodiment, a user may input selections and/or instructions responsive to data displayed to the user via the user interface.

In another embodiment, system 100 may include a network interface (not shown) configured to communicatively couple the controller 112 of system 100 to an outside network. In this regard, it is contemplated herein that any of the steps of the present disclosure which have been described as being carried out by the controller 112 and/or the one or more processors 114 may instead be carried out by a server or other remote processors via a network. By way of example, data stored in memory 118 (e.g., control patch images 111, parameters of training defects, patch images 111, and the like) may be transmitted by a user interface to a remote server or processor. In this regard, it is contemplated herein that the defect classifier may be trained on a remote server or processor.

It is noted that the network interface (not shown) may include any network interface circuitry or network interface device suitable for interfacing with a network. For example, the network interface circuitry may include wireline-based interface devices (e.g., DSL-based interconnection, cable-based interconnection, T9-based interconnection, and the like). In another embodiment, the network interface circuitry may include a wireless-based interface device employing GSM, GPRS, CDMA, EV-DO, EDGE, WiMAX, 3G, 4G, 4G LTE, 5G, WiFi protocols, RF, LoRa, and the like. By way of another example, the network interface may be configured to communicatively couple system 100 to a network with a cloud based architecture.

It is noted herein that the one or more components of system 100 (e.g., inspection sub-system 101, controller 112, and the like) may be communicatively coupled to the various other components of system 100 in any manner known in the art. For example, the one or more processors 114 may be communicatively coupled to each other and other components via a wireline (e.g., copper wire, fiber optic cable, and the like) or wireless connection (e.g., RF coupling, IR coupling, data network communication (e.g., 3G, 4G, 4G LTE, 5G, WiFi, WiMax, Bluetooth and the like)).

In one embodiment, the one or more processors 114 may include any one or more processing elements known in the art. In this sense, the one or more processors 114 may include any microprocessor-type device configured to execute software algorithms and/or instructions. In one embodiment, the one or more processors 114 may consist of a desktop computer, mainframe computer system, workstation, image computer, parallel processor, or other computer system (e.g., networked computer) configured to execute a program configured to operate the system 100, as described throughout the present disclosure. It should be recognized that the steps described throughout the present disclosure may be carried out by a single computer system or, alternatively, multiple computer systems. Furthermore, it should be recognized that the steps described throughout the present disclosure may be carried out on any one or more of the one or more processors 114. In general, the term "processor" may be broadly defined to encompass any device having one or more processing elements, which execute program instructions from memory 116. Moreover, different subsystems of the system 100 (e.g., inspection sub-system 101, controller 112, and the like) may include processor or logic elements suitable for carrying out at least a portion of the steps described throughout the present disclosure. Therefore, the above description should not be interpreted as a limitation on the present disclosure but merely an illustration.

The memory 116 may include any storage medium known in the art suitable for storing program instructions executable by the associated one or more processors 114 and the data received from the transmitting devices (e.g., parameters associated with known defects of control specimen 106a, control patch images 111, patch images 111, and the like). For example, the memory 116 may include a non-transitory memory medium. For instance, the memory 116 may include, but is not limited to, a read-only memory (ROM), a random access memory (RAM), a magnetic or optical memory device (e.g., disk), a magnetic tape, a solid state drive and the like. It is further noted that memory 116 may be housed in a common controller housing with the one or more processors 114. In an alternative embodiment, the memory 116 may be located remotely with respect to the physical location of the processors 114, controller 112, and the like. In another embodiment, the memory 116 maintains program instructions for causing the one or more processors 114 to carry out the various steps described through the present disclosure.

Figure 6:
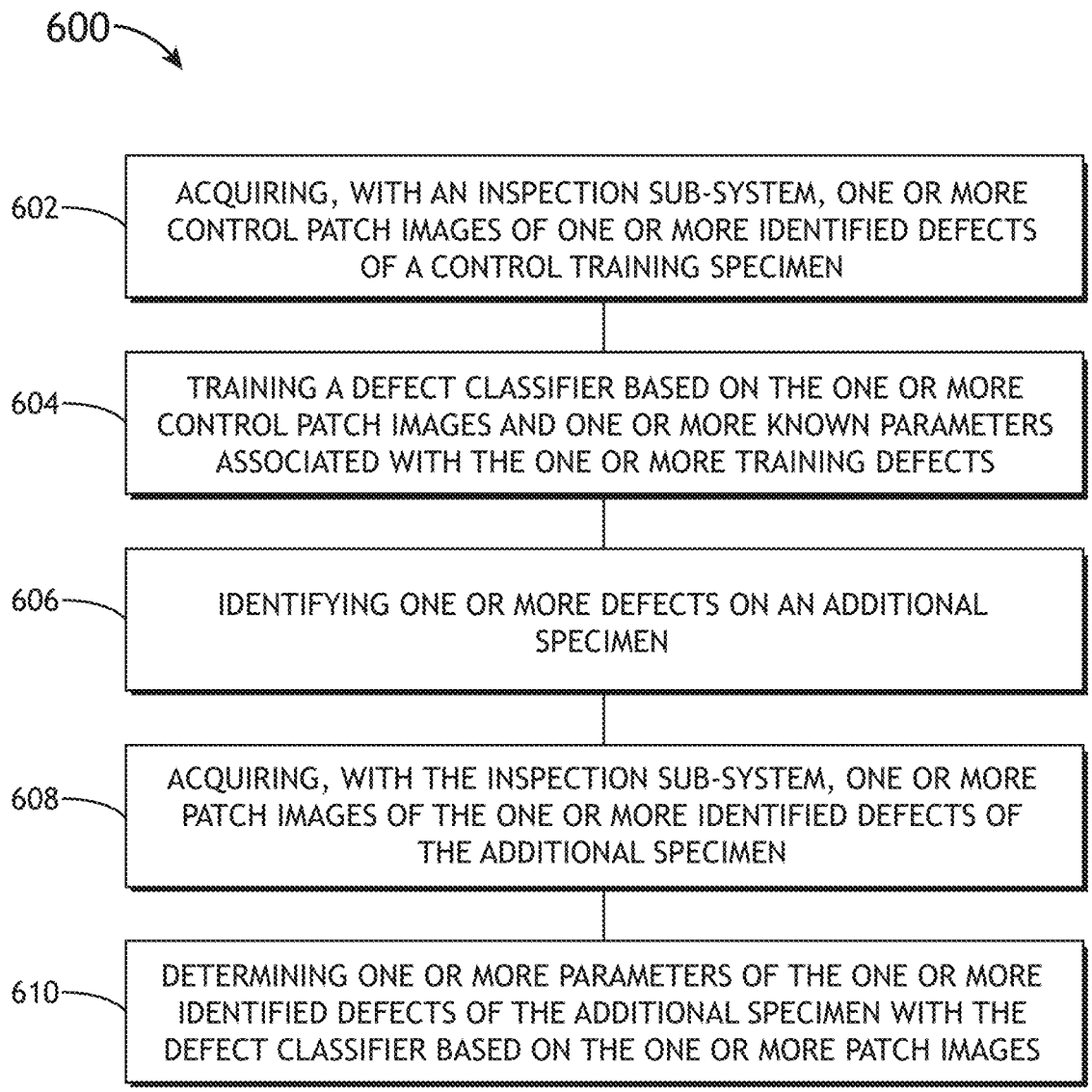
FIG. 6 illustrates a flowchart of a method for detecting and analyzing defects, in accordance with one or more embodiments of the present disclosure.

FIG. 6 illustrates a flowchart of a method 600 for detecting and analyzing defects, in accordance with one or more embodiments of the present disclosure. It is noted herein that the steps of method 600 may be implemented all or in part by system 100. It is further recognized, however, that the method 600 is not limited to the system 100 in that additional or alternative system-level embodiments may carry out all or part of the steps of method 600.

In step 602, one or more control patch images of one or more training defects of a control specimen are acquired with an inspection sub-system. For example, the set of program instructions may be configured to cause the one or more processors 114 to acquire, with the inspection sub-system 101, one or more control patch images 111 of one or more training defects of the control specimen 106a. As noted previously herein, training defects may be purposely created or "planted" within control specimen 106a such that various parameters (e.g., location, depth, size, type) may be known with a high degree of accuracy. Parameters associated with training defects may include, but are not limited to, the location of the defects, the depth of the defects, the size of the defects, the type of the defects (e.g., defect category), and the like.

In a step 604, a defect classifier is trained based on the one or more control patch images and one or more known parameters associated with the one or more training defects. The defect classifier may include any type of deep learning technique and/or machine learning algorithm or classifier known in the art including, but not limited to, a convolutional neural network (CNN) (e.g., GoogleNet, AlexNet, and the like), an ensemble learning classifier, a random forest classifier, artificial neural network (ANN), and the like.

In a step 606, one or more defects on an additional specimen are identified. For example, the one or more processors 114 may receive one or more images from the detectors 110 and utilize one or more detection algorithms to identify one or more defects of additional specimen 106b. It is noted herein that the one or more processors 114 may utilize any algorithm or detection procedure known in the art to identify one or more defects of additional specimen 106b.

In a step 608, one or more patch images of the one or more identified defects of the additional specimen are acquired with the inspection sub-system. For example, the one or more processors 114 may cause the one or more detectors 110 of inspection sub-system 101 to acquire patch images 111 of the additional specimen 106b. For instance, in embodiments with a three-detection-channel configuration, patch images 111 may be acquired along a first scattering direction, a second scattering direction, and a third scattering direction.

In a step 610, one or more parameters of the one or more identified defects of the additional specimen are identified with the defect classifier based on the one or more patch images. For example, the one or more patch images 111 of the additional specimen 106b may be provided to the trained defect classifier, wherein the trained defect classifier is configured to identify one or more parameters of the one or more identified defects. Parameters associated with the one or more identified defects of the additional specimen 106b may include, but are not limited to, the location of the defects, the depth of the defects, the size of the defects, the type of the defects (e.g., defect category), and the like.

One skilled in the art will recognize that the herein described components (e.g., operations), devices, objects, and the discussion accompanying them are used as examples for the sake of conceptual clarity and that various configuration modifications are contemplated. Consequently, as used herein, the specific exemplars set forth and the accompanying discussion are intended to be representative of their more general classes. In general, use of any specific exemplar is intended to be representative of its class, and the non-inclusion of specific components (e.g., operations), devices, and objects should not be taken as limiting.

Those having skill in the art will appreciate that there are various vehicles by which processes and/or systems and/or other technologies described herein can be effected (e.g., hardware, software, and/or firmware), and that the preferred vehicle will vary with the context in which the processes and/or systems and/or other technologies are deployed. For example, if an implementer determines that speed and accuracy are paramount, the implementer may opt for a mainly hardware and/or firmware vehicle; alternatively, if flexibility is paramount, the implementer may opt for a mainly software implementation; or, yet again alternatively, the implementer may opt for some combination of hardware, software, and/or firmware. Hence, there are several possible vehicles by which the processes and/or devices and/or other technologies described herein may be effected, none of which is inherently superior to the other in that any vehicle to be utilized is a choice dependent upon the context in which the vehicle will be deployed and the specific concerns (e.g., speed, flexibility, or predictability) of the implementer, any of which may vary.

The previous description is presented to enable one of ordinary skill in the art to make and use the invention as provided in the context of a particular application and its requirements. As used herein, directional terms such as "top," "bottom," "over," "under," "upper," "upward," "lower," "down," and "downward" are intended to provide relative positions for purposes of description, and are not intended to designate an absolute frame of reference. Various modifications to the described embodiments will be apparent to those with skill in the art, and the general principles defined herein may be applied to other embodiments. Therefore, the present invention is not intended to be limited to the particular embodiments shown and described, but is to be accorded the widest scope consistent with the principles and novel features herein disclosed.

With respect to the use of substantially any plural and/or singular terms herein, those having skill in the art can translate from the plural to the singular and/or from the singular to the plural as is appropriate to the context and/or application. The various singular/plural permutations are not expressly set forth herein for sake of clarity.

All of the methods described herein may include storing results of one or more steps of the method embodiments in memory. The results may include any of the results described herein and may be stored in any manner known in the art. The memory may include any memory described herein or any other suitable storage medium known in the art. After the results have been stored, the results can be accessed in the memory and used by any of the method or system embodiments described herein, formatted for display to a user, used by another software module, method, or system, and the like. Furthermore, the results may be stored "permanently," "semi-permanently," "temporarily," or for some period of time. For example, the memory may be random access memory (RAM), and the results may not necessarily persist indefinitely in the memory.

It is further contemplated that each of the embodiments of the method described above may include any other step(s) of any other method(s) described herein. In addition, each of the embodiments of the method described above may be performed by any of the systems described herein.

The herein described subject matter sometimes illustrates different components contained within, or connected with, other components. It is to be understood that such depicted architectures are merely exemplary, and that in fact many other architectures can be implemented which achieve the same functionality. In a conceptual sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "connected," or "coupled," to each other to achieve the desired functionality, and any two components capable of being so associated can also be viewed as being "couplable," to each other to achieve the desired functionality. Specific examples of couplable include but are not limited to physically mateable and/or physically interacting components and/or wirelessly interactable and/or wirelessly interacting components and/or logically interacting and/or logically interactable components.

Furthermore, it is to be understood that the invention is defined by the appended claims. It will be understood by those within the art that, in general, terms used herein, and especially in the appended claims (e.g., bodies of the appended claims) are generally intended as "open" terms (e.g., the term "including" should be interpreted as "including but not limited to," the term "having" should be interpreted as "having at least," the term "includes" should be interpreted as "includes but is not limited to," and the like). It will be further understood by those within the art that if a specific number of an introduced claim recitation is intended, such an intent will be explicitly recited in the claim, and in the absence of such recitation no such intent is present. For example, as an aid to understanding, the following appended claims may contain usage of the introductory phrases "at least one" and "one or more" to introduce claim recitations. However, the use of such phrases should not be construed to imply that the introduction of a claim recitation by the indefinite articles "a" or "an" limits any particular claim containing such introduced claim recitation to inventions containing only one such recitation, even when the same claim includes the introductory phrases "one or more" or "at least one" and indefinite articles such as "a" or "an" (e.g., "a" and/or "an" should typically be interpreted to mean "at least one" or "one or more"); the same holds true for the use of definite articles used to introduce claim recitations. In addition, even if a specific number of an introduced claim recitation is explicitly recited, those skilled in the art will recognize that such recitation should typically be interpreted to mean at least the recited number (e.g., the bare recitation of "two recitations," without other modifiers, typically means at least two recitations, or two or more recitations). Furthermore, in those instances where a convention analogous to "at least one of A, B, and C, and the like" is used, in general such a construction is intended in the sense one having skill in the art would understand the convention (e.g., "a system having at least one of A, B, and C" would include but not be limited to systems that have A alone, B alone, C alone, A and B together, A and C together, B and C together, and/or A, B, and C together, and the like). In those instances where a convention analogous to "at least one of A, B, or C, and the like" is used, in general such a construction is intended in the sense one having skill in the art would understand the convention (e.g., "a system having at least one of A, B, or C" would include but not be limited to systems that have A alone, B alone, C alone, A and B together, A and C together, B and C together, and/or A, B, and C together, and the like). It will be further understood by those within the art that virtually any disjunctive word and/or phrase presenting two or more alternative terms, whether in the description, claims, or drawings, should be understood to contemplate the possibilities of including one of the terms, either of the terms, or both terms. For example, the phrase "A or B" will be understood to include the possibilities of "A" or "B" or "A and B."

It is believed that the present disclosure and many of its attendant advantages will be understood by the foregoing description, and it will be apparent that various changes may be made in the form, construction and arrangement of the components without departing from the disclosed subject matter or without sacrificing all of its material advantages. The form described is merely explanatory, and it is the intention of the following claims to encompass and include such changes. Furthermore, it is to be understood that the invention is defined by the appended claims.

What is claimed:

1. A system, comprising:
   an inspection sub-system, wherein the inspection sub-system includes one or more detection channels configured to acquire one or more patch images along one or more scattering angles from a specimen; and
   a controller communicatively coupled to the inspection sub-system, the controller including one or more processors and memory, wherein the one or more processors are configured to execute a set of program instructions stored in the memory, the set of program instructions configured to cause the one or more processors to:
   receive one or more control patch images of one or more training defects of a control specimen comprising at least one of a semiconductor substrate or a VNAND stack from the inspection sub-system;
   train a defect classifier based on the one or more control patch images acquired from the one or more training defects and one or more known parameters associated with the one or more training defects;
   direct the inspection sub-system to identify one or more defects of an additional specimen;
   receive one or more patch images of the one or more identified defects of the additional specimen from the inspection sub-system; and
   apply the defect classifier to the one or more patch images of the one or more identified defects of the additional specimen to determine one or more parameters of the one or more identified defects of the additional specimen.

2. The system of claim 1, further comprising one or more process tools, wherein the one or more processors are further configured to adjust one or more characteristics of the one or more process tools.

3. The system of claim 2, wherein the one or more process tools include at least one of a lithography tool and a polishing tool.

4. The system of claim 1, wherein the one or more parameters comprise at least one of a defect size and a defect depth.

5. The system of claim 1, wherein the inspection sub-system comprises a first detection channel configured to acquire one or more patch images along a first scattering direction, a second detection channel configured to acquire one or more patch images along a second scattering direction, and at least a third detection channel configured to acquire one or more patch images along at least a third scattering direction.

6. The system of claim 5, wherein the one or more processors are further configured to adjust the focus of at least one of the first detection channel, the second detection channel, and the at least third detection channel.

7. The system of claim 1, wherein the defect classifier comprises a convolutional neural network (CNN).

8. The system of claim 1, wherein the additional specimen comprises at least one of a semiconductor substrate and a VNAND stack.

9. The system of claim 1, wherein the one or more processors are further configured to combine the one or more patch images of the one or more identified defects of the additional specimen into an RGB image.

10. The system of claim 1, wherein the one or more processors are further configured to categorize the one or more training defects of the control specimen into one or more defect categories.

11. A system, comprising:
    a controller communicatively coupled to an inspection sub-system, the controller including one or more processors and memory, wherein the one or more processors are configured to execute a set of program instructions stored in the memory, the set of program instructions configured to cause the one or more processors to:
    receive one or more control patch images of one or more training defects of a control specimen comprising at least one of a semiconductor substrate or a VNAND stack from the inspection sub-system;
    train a defect classifier based on the one or more control patch images acquired from the one or more training defects and one or more known parameters associated with the one or more training defects;

direct the inspection sub-system to identify one or more defects of an additional specimen;

receive one or more patch images of the one or more identified defects of the additional specimen from the inspection sub-system; and apply the defect classifier to the one or more patch images of the one or more identified defects of the additional specimen to determine one or more parameters of the one or more identified defects of the additional specimen.

12. The system of claim 11, further comprising one or more process tools, wherein the one or more processors are further configured to adjust one or more characteristics of the one or more process tools.

13. The system of claim 12, wherein the one or more process tools include at least one of a lithography tool and a polishing tool.

14. The system of claim 11, wherein the one or more parameters comprise at least one of a defect size and a defect depth.

15. The system of claim 11, wherein the inspection sub-system comprises a first detection channel configured to acquire one or more patch images along a first scattering direction, a second detection channel configured to acquire one or more patch images along a second scattering direction, and at least a third detection channel configured to acquire one or more patch images along at least a third scattering direction.

16. The system of claim 15, wherein the one or more processors are further configured to adjust the focus of at least one of the first detection channel, the second detection channel, and the at least third detection channel.

17. The system of claim 11, wherein the defect classifier comprises a convolutional neural network (CNN).

18. The system of claim 11, wherein the additional specimen comprises at least one of a semiconductor substrate and a VNAND stack.

19. The system of claim 11, wherein the one or more processors are further configured to combine the one or more patch images of the one or more identified defects of the additional specimen into an RGB image.

20. The system of claim 11, wherein the one or more processors are further configured to categorize the one or more training defects of the control specimen into one or more defect categories.

21. A method for measuring depth and size of buried defects in a specimen, comprising:

acquiring, with an inspection sub-system, one or more control patch images of one or more training defects of a control specimen comprising at least one of a semiconductor substrate and a VNAND stack;

training a defect classifier based on the one or more control patch images and one or more known parameters associated with the one or more training defects;

identifying one or more defects on an additional specimen;

acquiring, with the inspection sub-system, one or more patch images of the one or more identified defects of the additional specimen; and determining one or more parameters of the one or more identified defects of the additional specimen with the defect classifier based on the one or more patch images.

22. The method of claim 21, further comprising adjusting one or more characteristics of a process tool based on the determined one or more parameters of the one or more identified defects.

23. The method of claim 21, wherein the one or more parameters comprise at least one of a defect size and a defect depth.

24. The method of claim 21, wherein the inspection sub-system comprises a first detection channel configured to acquire patch images along a first scattering direction, a second detection channel configured to acquire patch images along a second scattering direction, and at least a third detection channel configured to acquire patch images along at least a third scattering direction.

25. The method of claim 24, further comprising adjusting the focus of at least one of the first detection channel, the second detection channel, and the at least third detection channel.

26. The method of claim 21, wherein the defect classifier comprises a convolutional neural network (CNN).

27. The method of claim 21, wherein the additional specimen comprises at least one of a semiconductor substrate and a VNAND stack.

28. The method of claim 21, further comprising combining the one or more patch images of the one or more identified defects of the additional specimen into an RGB image.

29. The method of claim 21, further comprising categorizing the one or more training defects of the control specimen into one or more defect categories.

* * * * *